United States Patent [19]

Saginao et al.

[11] Patent Number: 5,193,221
[45] Date of Patent: Mar. 9, 1993

[54] SIGNAL OUTPUT APPARATUS

[75] Inventors: Kazuteru Saginao, Yokohama; Hideyuki Okanuma, Tokyo, both of Japan

[73] Assignee: Kabushiki Kaisha Toshiba, Kawasaki, Japan

[21] Appl. No.: 581,330

[22] Filed: Sep. 12, 1990

[30] Foreign Application Priority Data

Sep. 14, 1989 [JP] Japan .................................. 1-239474

[51] Int. Cl.$^5$ ............................................. H04B 1/02
[52] U.S. Cl. .................................... 455/92; 455/151.1; 455/151.2; 455/151.4; 340/825.04; 340/825.72; 359/146; 375/118
[58] Field of Search .................................. 455/92, 151; 340/825.04, 825.72; 359/146; 375/118

[56] References Cited

U.S. PATENT DOCUMENTS

| 4,760,392 | 7/1988 | Yamamoto et al. | 340/825.72 |
| 4,802,114 | 1/1989 | Sogame | 340/825.72 |
| 4,866,434 | 9/1989 | Keenan | 340/825.72 |

FOREIGN PATENT DOCUMENTS 0050889 3/1983 Japan .............................. 340/825.72

Primary Examiner—Reinhard J. Eisenzopf
Assistant Examiner—Timothy H. Keough
Attorney, Agent, or Firm—Foley & Lardner

[57] ABSTRACT

A signal output apparatus particularly suitable for wireless remote control unit is disclosed. This signal output apparatus includes a CPU section; an output data storage section for storing an output data given by the CPU section; a main clock signal generator section; a count section for generating a timing signal for representing the output data in accordance with the main clock signal generated by the main clock signal generator; an output control section for generating an output control signal whose level changes with the contents of the output data, in response to the timing signal; and a signal output section for receiving the main clock signal and the output control signal for outputting the main clock signal intermittent in response to the level change of the output control signal. The main clocks are modulated by the output control section and signal output section of the signal output apparatus.

6 Claims, 5 Drawing Sheets

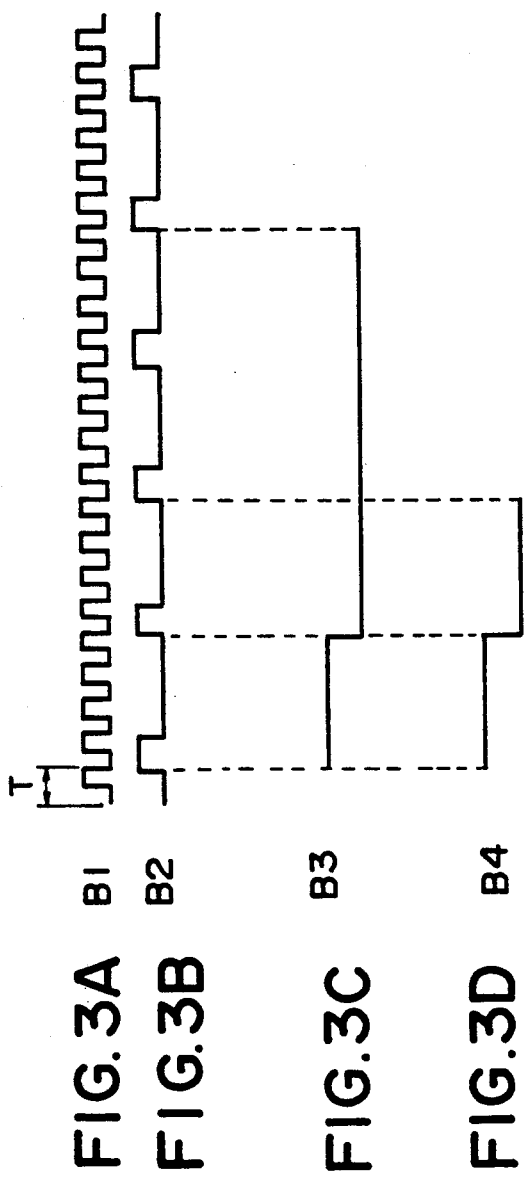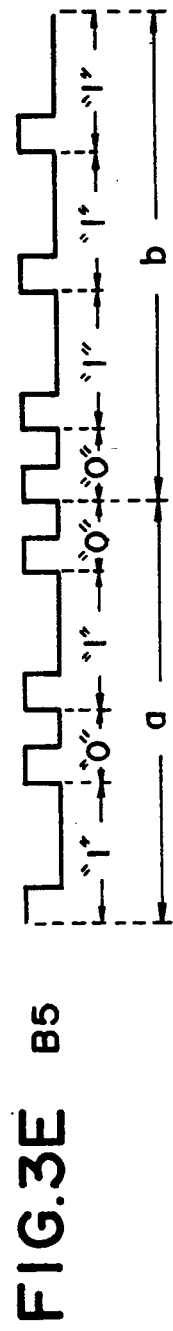

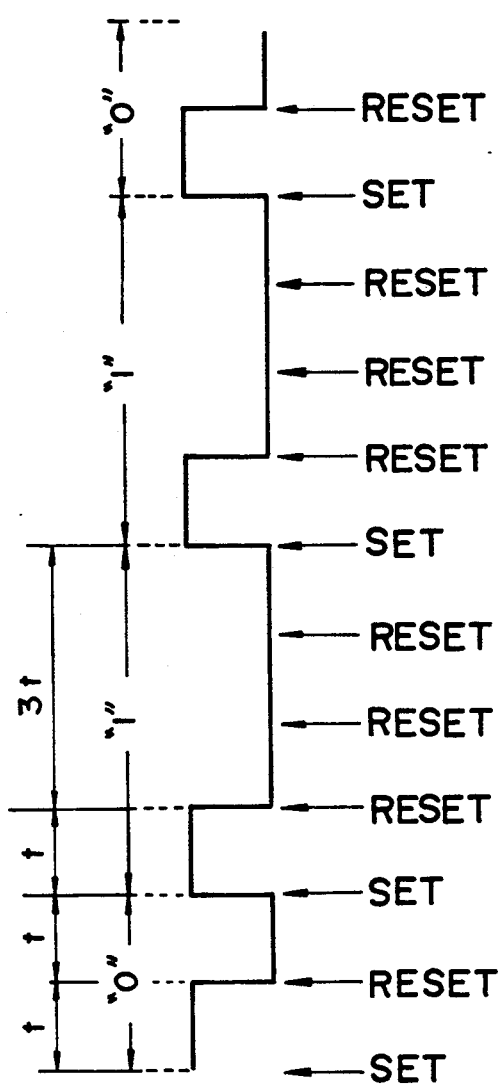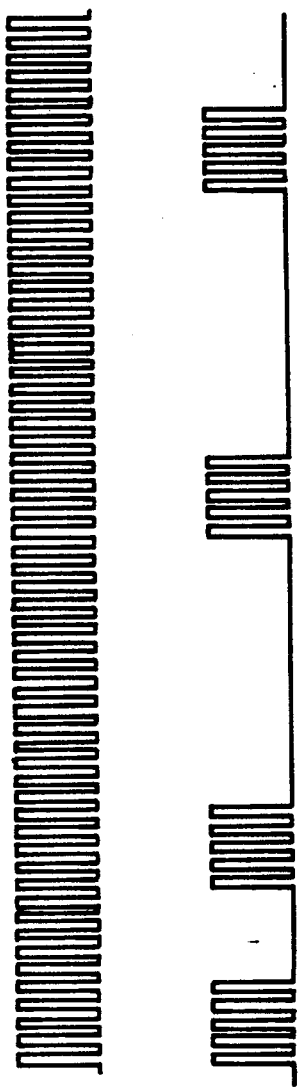
FIG.5A A1
FIG.5B A2
FIG.5C A3
PRIOR ART

SIGNAL OUTPUT APPARATUS

BACKGROUND OF THE INVENTION

The present invention relates to a signal output apparatus, and more particularly to a signal output apparatus suitable for use as a wireless remote control unit (commander) which transmits temporarily stored data to a controlled apparatuses.

Various types of output apparatus are known which output control signals or the like to a controlled apparatus. For example, in the case of a VTR, a wireless remote control unit with a built-in CPU, temporarily stores data such as reserved program recording data which include the date and time of program start/end, channel number, and the like, and thereafter outputs the data to a controlled VTR.

A conventional signal output apparatus is constructed as shown in FIG. 4. Under control of a CPU section 102, data entered by an operator is temporarily stored in an output data storage unit 101 having a RAM, decoder and the like. When the data is to be output, the CPU section 102 fetches the data and controls main clocks (carrier) (A2) to be output from a signal output section 105 in accordance with the fetched data. Main clocks from the CPU section 102 have the waveform as shown in FIG. 5B. A time count section 104 instructs the control timings when the main clocks (A2) are output. Each time an instruction is received, the CPU section 102 sends a set command or a reset command to the signal output section 105. This command is composed of an output control signal (A1) such as shown in FIG. 5A. Data "0" is represented by a combination of one period t of high level and one period t of low level, whereas data "1" is represented by a combination of one period t of high level and three periods 3t of low level. For example, data "0110" stored in the output data storage section 101 are converted into a signal A1 shown in FIG. 5A. At the rising edge of the output control signal A1, a set command is sent to the signal output section 105, and at the falling edge thereof, a reset command is sent to the signal output section 105. The signal output section 105 outputs main clocks when it receives the set command and stops outputting them when the reset command is received. The data are output as the signal A3 as shown in FIG. 5C.

All the processes for generating an output control signal A1 from given data are executed by the CPU section 102. Accordingly, during executing these processes, the CPU section 102 cannot execute other processes. Furthermore, it requires much labor and time for obtaining software used for the execution of these processes by the CPU section, thereby resulting in an increased cost.

SUMMARY OF THE INVENTION

It is an object of the present invention to provide a signal output apparatus wherein even while a signal is output, a CPU section can execute other processes at the same time.

It is another object of the present invention to provide a signal output apparatus capable of reducing cost by eliminating the labor and time for obtaining software used for processing the output of a carrier.

According to the present invention, there is provided a signal output apparatus having: a CPU section; output data storage means for storing an output data given by the CPU section; a main clock signal generating means outputting a main clock signal; count means for generating a timing signal used for representing the output data in accordance with the main clock signal generated by the main clock signal generating means; output control means for generating an output control signal whose level changes with the contents of the output data, in response to the timing signal; and signal output means for receiving the main clock signal and the output control signal for outputting the main clock signal intermittent in response to the level change of the output control signal.

According to the present invention, there is also provided a remote control commander having: a CPU section; output data storage means for storing an output data given by the CPU section; a main clock signal generating means outputting a main clock signal; count means for generating a timing signal for representing the output data in accordance with the main clock signal generated by the main clock signal generating means; output control means for generating an output control signal whose level changes with the contents of the output data, in response to the timing signal; signal output means for receiving the main clock signal and the output control signal for outputting the main clock signal intermittently in response to the level change of the output control signal; and conversion means for receiving the intermittent main clock signal and generating a remote control signal.

Data to be output are first given from a CPU section and temporarily stored in an output data storage section. The data are then given to an output control section to generate an output control signal in accordance with the frequency of a signal given from a count section. The output control signal controls a signal output section to thereby output a signal composed of intermittent main clocks. In this case, if the CPU section executes the processes for generating an output control signal from data given by the output data storage section, it cannot execute other processes. However, since not the CPU section but the output control section executes the processes required for controlling a carrier, the CPU section can execute other processes at the same time, thereby improving the process efficiency.

Furthermore, the output control section may include an address selection circuit, a parallel-to-serial circuit, and an output control circuit. With such hardware arrangement, cost can be reduced by eliminating labor and time for obtaining software used for the execution of such processes by the CPU section.

BRIEF DESCRIPTION OF THE DRAWINGS

FIGS. 3A to 3E show signal waveforms at various circuit portions of the signal output apparatus shown in FIGS. 1 and 2;

FIGS. 5A to 5C show signal waveforms at various circuit portions of the signal output apparatus shown in FIG. 4.

DESCRIPTION OF THE PREFERRED EMBODIMENT

Figure 1:
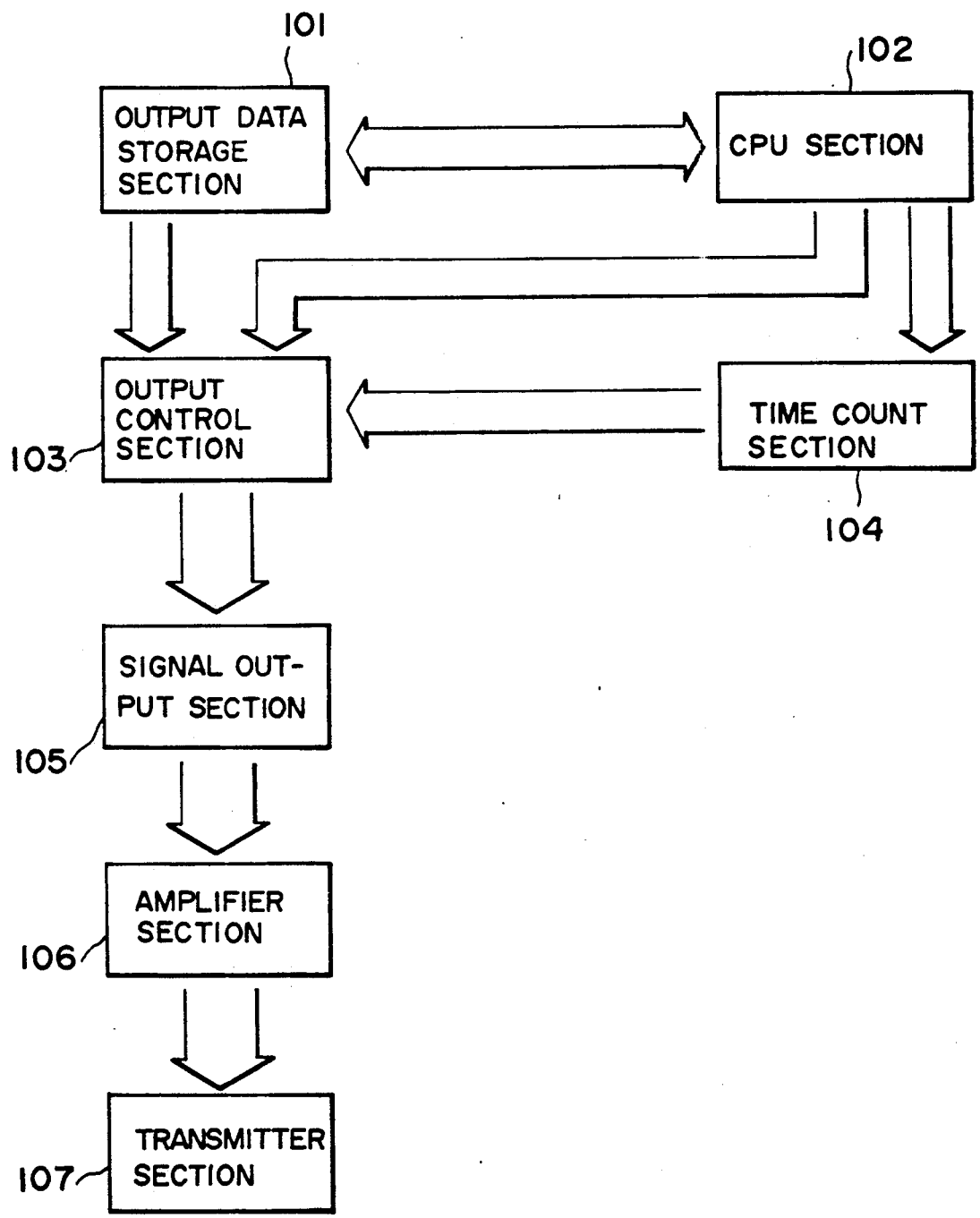
FIG. 1 is a block diagram showing the structure of a signal output apparatus according to an embodiment of this invention.

An embodiment of this invention will be described with reference to the accompanying drawings. The structure of a wireless remote control unit as an embodiment of this invention is shown in FIG. 1. As compared with the structure of a conventional apparatus shown in FIG. 5, there are provided additional circuits including an output control section 103 between a CPU section 102 and a signal output section 105, and those circuit portions for amplifying and transmitting a signal.

Data entered by an operator are temporarily stored in an output data storage section 101 under the control of the CPU section 102. When the data are to be output, the data are fetched not by the CPU section 102 but by the output control section 103. Upon receipt of a start command from the CPU section 102, the output control section 103 outputs an output control signal to a signal output section 105 in accordance with the period of a signal output from a time count section 104. Instead of the CPU section 102, the output control section 103 receives the data temporarily stored in the output data storage section 101, and executes the processes for generating the output control signal which controls the output of the signal output section 105. Accordingly, the CPU section 102 can execute other processes at the same time.

A signal output from the signal output section 105 is amplified by an amplifier 106. The amplified signal drives an infrared light emitting diode in a transmitter section 107 to thereby output a remote control signal. A signal outputted from the remote controller may be an ultrasonic wave, electromagnetic wave or the like.

Figure 2:
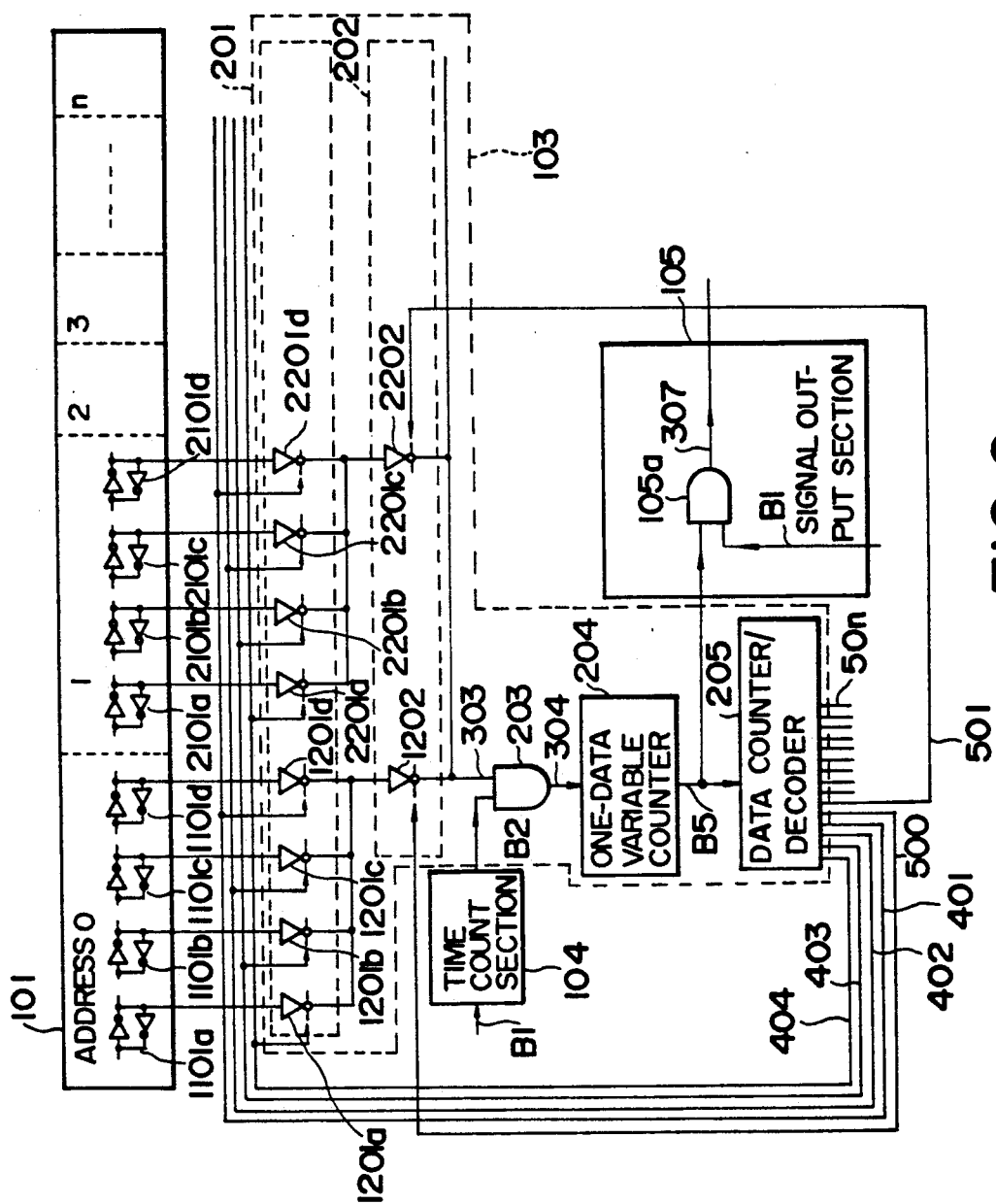
FIG. 2 is a circuit diagram of the signal output apparatus shown in FIG. 1.
Figure 4:
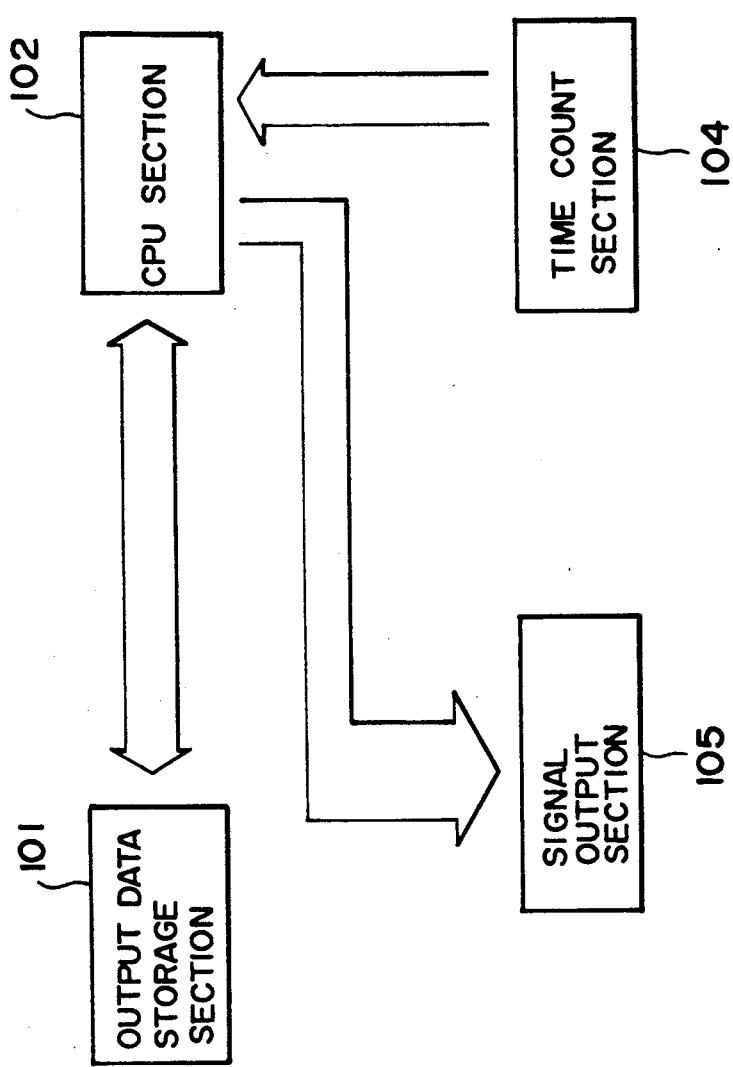
FIG. 4 is a block diagram showing the structure of a conventional signal output apparatus.

A more particular circuit of the apparatus having the above-described fundamental structure will be described with reference to FIG. 2. This circuit shown in FIG. 2 corresponds to the output data storage unit section, output control section 103, time count section 104, and signal output section 105 among the circuit blocks shown in FIG. 1. The output control section 103 includes an address selection circuit provided for respective addresses of the output data storage section 101, a parallel-to-serial circuit 201 for time sequentially rearranging parallel data at each address into serial data, an AND circuit 203 for obtaining a logical AND between the outputs from the parallel-to-serial circuit and from the time count section 104, a one-data variable counter 204 for generating an output control signal, and a data counter and decoder 205.

The output data storage section 101 stores (n+1) four-bit data (n is an integer). Using the stored data, the circuit elements of the output control section 103 generate the output control signal B5 and output it to the signal output section 105. First, the data counter decoder 205 receives a start command from the CPU section 102 and an address signal of the output data storage section 101 which is then decoded. Address selection signals 500, 501, . . . , 50n for selecting the addresses 0 to n are output to the address selection circuit 202, and parallel-to-serial signals for obtaining four-bit serial signals are output to the parallel-to-serial circuit 201. For example, assuming that address "0" is selected, the level of signal 500 corresponding to address "0" among the address selection signals 500 to 50n is changed to thereby open only the gate 202 of the address selection circuit 202. In addition, the levels of signals 401 to 404 are sequentially changed to open the gates 1201a, 1201b, 1201c, and 1201d of the parallel-to-serial circuit 201 in this order recited. Accordingly, the data stored in memory cells 1101a to 1101d at address "0" are serially output as signal 303 from the parallel-to-serial circuit 201.

The time count unit 104 is supplied, from the CPU section 102, with a main clock signal B1 (FIG. 3A) having a period T as shown in FIG. 3. The time count section 104 generates a signal B2 (FIG. 3B) having the period 4T and supplies it to the AND circuit 203. The AND circuit 203 obtains a logical AND between the signal B2 and signal 303 from the gate 1202 of the address selection circuit 202. This logical AND is sent as a data signal 304 to the one-data variable counter 204. Accordingly, the data signal corresponding to the period 4T of the signal B2 is supplied to the one-data variable counter 204.

The one-data variable counter 204 converts the data signal 304 into an output control signal B5 (FIG. 3E) which controls the output of the signal output section 105. The data signal 304 of "1" is converted into a signal B3 shown in FIG. 3C having four periods (16T) of the signal B2 including one period (4T) of high level and three periods (12T) of low level. The data signal 304 of "0" is converted into a signal B4 shown in FIG. 3D having two periods (8T) of the signal B2 including one period (4T) of high level and one period (4T) of low level. The converted output control signal B5 and the clock signal B1 from the CPU section 102 are supplied to an AND gate 105a to output the logical AND which is a signal 307.

For example, it is assumed that data "1010" are stored in respective memory cells of the data storage section 101 at address "0" and data "0111" are stored at address "1". In outputting these data serially, the gates of the parallel-to-serial circuit 201 and address selection circuit 202 are controlled by the signals from the data counter and decoder 205 as described previously. First, the data at address "0" are sequentially output to the one-data variable counter 204 as a signal at section a of the output control signal B5 shown in FIG. 3E. A carrier output controlled or modulated by the signal B5, i.e., a signal 307 (B6), is outputted from the signal output section 105. After completion of outputting the data at address "0", the gates of the parallel-to-serial circuit 201 and address selection circuit 202 are controlled by the data counter and decoder 205. Accordingly, the data "0111" stored at address "1" are sequentially output to the one-data variable counter 204 as a signal at section b of the output control signal B5 shown in FIG. 3E. A carrier controlled or modulated by the signal B5, i.e., a signal 307, is output from the signal output section 105. In the above manner, the data at addresses "0" to "n" in the data storage section 101 are sequentially output.

According to this embodiment, the processes necessary for the data output are executed not by the CPU section but by the output control section constructed of the address selection circuit 202, parallel-to-serial circuit 201, AND circuit 203, one-data variable counter 204, and data counter and decoder 205. Accordingly, the CPU section 102 is released from such signal output processes and can execute other processes at the same time, thereby improving the process efficiency. Furthermore, although software for the execution of such processes by the CPU section must be provided with much labor and time, such labor and time can be eliminated by hardware processing as in this embodiment, thereby reducing the cost.

The above embodiment has been given as one example and is not intended to limit the scope of the present invention. For example, a circuit different from that shown in FIG. 2 may also be used. The output control section in particular may take various forms with similar advantageous effects if only it can generate the control signal which modulates a carrier by the stored data. Furthermore, the function of the output control section may be realized by providing another CPU section so that processes other than the signal output process can be executed at the same time. However, this case is less cost effective than the hardware arrangement of an embodiment dedicated to the signal output process.

What is claimed is:

1. A signal output apparatus comprising:
    a CPU section;
    output data storage means for storing output data from said CPU section;
    main clock signal generating means outputting a main clock signal;
    a count circuit receiving said main clock signal and outputting a timing signal equal to a predetermined number of said main clock signals;
    output control means for generating an output control signal comprised of "0" data and "1" data according to said output data, said "0" data and "1" data being expressed by different combinations of high level period and low level period, in response to said timing signal, wherein said output control means includes:
        an address selection circuit for decoding an address signal output by said CPU section and selecting an address of said output data storage unit,
        a parallel-to-serial circuit for time sequentially outputting the data in said output data storage unit at an address selected by said address selection circuit, and
        a one-data variable counter receiving a logical AND between an output from said count unit and an output from said parallel-to-serial circuit at said selected address and outputting said output control signal; and
    signal output means, receiving said main clock signal and said output control signal, for outputting said main clock signal intermittently in response to a level change of said output control signal.

2. A signal output apparatus according to claim 1, wherein said main clock signal generating means is included in said CPU section.

3. A signal output apparatus according to claim 1, wherein said count means includes means for generating a signal obtained from said main clock signal through frequency-division.

4. A signal output apparatus according to claim 3, wherein said signal output unit is a logical AND means for obtaining a logical AND between said main clock signal and said output control signal.

5. A remote control commander comprising:
    a CPU section;
    output data storage means for storing output data from said CPU section;
    main clock signal generating means outputting a main clock signal;
    a count circuit receiving said main clock signal and outputting a timing signal equal to a predetermined number of said main clock signals;
    output control means for generating an output control signal comprised of "0" data and "1" data according to said output data, said "0" data and "1" data being expressed by different combinations of high level period and low level period, in response to said timing signal, wherein said output control means includes:
        an address selection circuit for decoding an address signal output by said CPU section and selecting an address of said output data storage unit,
        a parallel-to-serial circuit for time sequentially outputting the data in said output data storage unit at an address selected by said address selection circuit, and
        a one-data variable counter receiving a logical AND between an output from said count unit and an output from said parallel-to-serial circuit at said selected address and outputting said output control signal;
    signal output means, receiving said main clock signal and said output control signal, for outputting said main clock signal intermittently in response to a level change of said output control signal; and
    conversion means for receiving said intermittent main clock signal and generating a remote control signal.

6. A remote control commander according to claim 5, wherein said conversion means is means for converting into infrared light.

* * * * *